US012771339B2

(12) United States Patent
Yu et al.

(10) Patent No.: US 12,771,339 B2
(45) Date of Patent: Oct. 20, 2026

(54) MULTI-STAGE ADAPTIVE GATE DRIVE CONTROL

(71) Applicant: Alpha and Omega Semiconductor International LP, Toronto (CA)

(72) Inventors: Ziwei Yu, Cupertino, CA (US); Lin Chen, San Jose, CA (US); Jian Yin, San Ramon, CA (US)

(73) Assignee: Alpha and Omega Semiconductor International LP, Toronto (CA)

( * ) Notice: Subject to any disclaimer, the term of this patent is extended or adjusted under 35 U.S.C. 154(b) by 18 days.

(21) Appl. No.: 18/887,209

(22) Filed: Sep. 17, 2024

(65) Prior Publication Data

US 2026/0081592 A1 Mar. 19, 2026

(51) Int. Cl.
*H03K 17/16* (2006.01)

(52) U.S. Cl.
CPC ... *H03K 17/162* (2013.01); *H03K 2217/0063* (2013.01); *H03K 2217/0072* (2013.01)

(58) Field of Classification Search
CPC ......... H03K 17/162; H03K 2217/0063; H03K 2217/0072
See application file for complete search history.

(56) References Cited

U.S. PATENT DOCUMENTS

2009/0153110 A1* 6/2009 Huang .................... H02J 1/102 323/282
2013/0300388 A1* 11/2013 Laur .................... H02M 3/156 323/282
2013/0300392 A1* 11/2013 Laur .................... H02M 3/156 323/284
2016/0109490 A1* 4/2016 Diewald .............. G06F 1/3212 324/126

* cited by examiner

*Primary Examiner* — Sibin Chen
(74) *Attorney, Agent, or Firm* — Thompson Patent Law Offices PC

(57) ABSTRACT

Apparatus and associated methods relate to a gate drive timing controller (GDTC). In an illustrative example, the GDTC may generate a power stage activation signal (PSAS) to control an output current of a MOSFET(s) of the power stage. Three pullup transistors, for example, may be electrically connected to the control output in parallel, configured to generate the PSAS as a function of a switch node voltage (Vsw) and a source inductance voltage (VLS) of the MOSFET. For example, a first pullup transistor may be activated when a PWM signal for the power stage is received, and deactivated based on the VLS. For example, a second pullup transistor may be synchronized with the PWM signal. For example, a third pullup transistor may be activated when the Vsw is detected. Various embodiments may advantageously generate the PSAS adaptively to reduce turn-on loss of the MOSFET while keeping a low transient voltage spike.

19 Claims, 6 Drawing Sheets

MULTI-STAGE ADAPTIVE GATE DRIVE CONTROL

TECHNICAL FIELD

Various embodiments relate generally to power electronics and circuit control.

BACKGROUND

A hard switching power converter (HSPC) may include power electronics configured to manage the conversion of electrical energy between different voltage levels. In some examples, the HSPC may control switch transitions between on and off states while maintaining a load current supplied to a (high power) load. In some examples, the HSPC may include a half-bridge configuration. For example, the half-bridge configuration may include two switches (e.g., two metal-oxide-semiconductor field-effect transistors (MOSFETs)) connected in series between the power supply and ground. For example, a junction between these two switches may form a switching node, which defines the output voltage or current supplied to the load.

The switch node voltage, for example, may include a voltage present at the junction between the two MOSFETs in the half-bridge configuration. This voltage, for example, may influence the voltage supplied to the load. The load, for example, may be connected between the switch node and ground. In some examples, the load may be connected between the switch node and the positive power supply. The behavior of the switch node voltage during the switching events of the MOSFETs may determine an (transient and/or steady-state) output power of the HSPC.

In high-power applications, for example, the HSPC may include multiple MOSFETs in parallel. For example, parallel-connected MOSFETs may include varying response characteristics amongst the MOSFETs (e.g., different parasitic impedance, voltage thresholds).

SUMMARY

Apparatus and associated methods relate to a gate drive timing controller (GDTC). In an illustrative example, the GDTC may generate a power stage activation signal (PSAS) to control an output current of a MOSFET(s) of the power stage. Three pullup transistors, for example, may be electrically connected to the control output in parallel, configured to generate the PSAS as a function of a switch node voltage (Vsw) and a source inductance voltage (VLS) of the MOSFET. For example, a first pullup transistor may be activated when a PWM signal for the power stage is received, and deactivated based on the VLS. For example, a second pullup transistor may be synchronized with the PWM signal. For example, a third pullup transistor may be activated when the Vsw is detected. Various embodiments may advantageously generate the PSAS adaptively to reduce turn-on loss of the MOSFET while keeping a low transient voltage spike.

Various embodiments may achieve one or more advantages. For example, some embodiments may advantageously reduce a turn-on loss at (e.g., parallel connected) MOSFETs of the power stage. For example, some embodiments may advantageously adapt the power stage activation signals to different loading currents automatically. For example, some embodiments may advantageously reduce a turn-off loss at (e.g., parallel connected) MOSFETs of the power stage. For example, some embodiments may advantageously adapt the power stage deactivation signals to different loading currents automatically.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Figure 1:
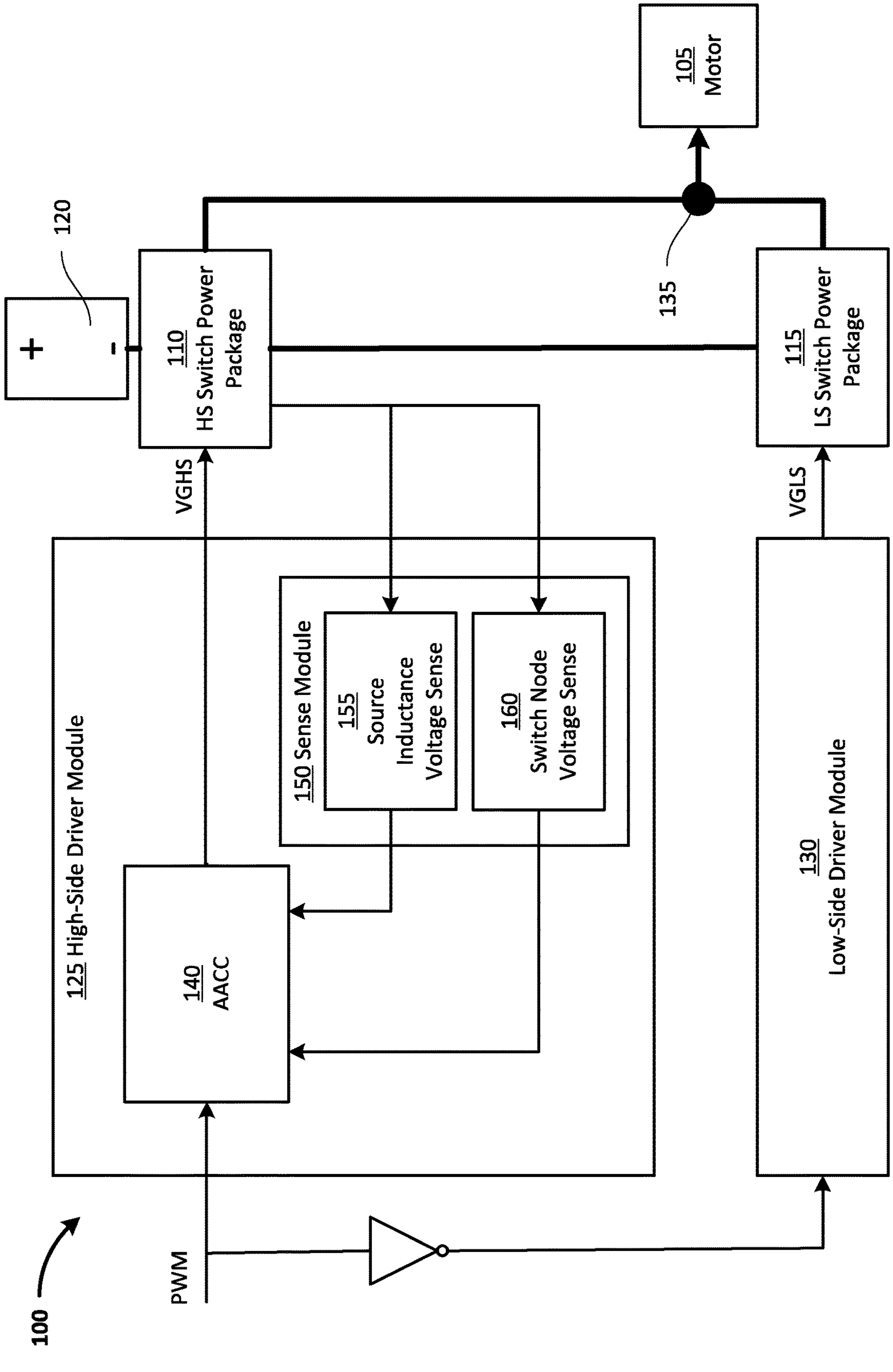
FIG. 1 depicts an exemplary adaptive power control system (APCS) employed in an illustrative use-case scenario.

FIG. 1 depicts an exemplary adaptive power control system (APCS) employed in an illustrative use-case scenario. In the depicted example, an APCS 100 includes a motor 105 electrically connected to a high-side switch power package (HSPP 110) and a low-side switch power package (LSPP 115). For example, the HSPP 110 and the LSPP 115 may include a silicon (Si) power device.

For example, the motor 105 may include a hard switching power converter configured to supply power to the motor 105. For example, the HSPP 110 and the LSPP 115 may be configured in a half-bridge topology. In some implementations, the motor 105 may include a high power application. For example, the motor 105 may include a high power alternative current (AC) motor.

In some implementations, the HSPP 110 and the LSPP 115 may include a switching circuit. The HSPP 110 and the LSPP 115, in this example, are connected in series to receive power from a DC power source 120. In some implementations, the HSPP 110 and the LSPP 115 may include multiple parallel connected switch transistors (e.g., metal-oxide-semiconductor field-effect transistors (MOSFETs)) configured to supply a high current to the motor 105. For example, the HSPP 110 may include multiple power MOSFETs connected in parallel. For example, each of the power MOSFET may include a source terminal operably coupled to the DC power source 120.

In some implementations, multiple MOSFETs connected in parallel may share a current load to the motor 105. For example, the multiple MOSFETs connected in parallel may advantageously reduce an overall on-resistance (Rds(on)) of the APCS 100. In some examples, the HSPP 110 and the LSPP 115 may be implemented on a printed circuit board (PCB).

As shown, the HSPP 110 receives a first switch control signal (VGHS) from a high-side power driving circuit (HDM 125), and the LSPP 115 receives a second switch control signal (VGLS) from a low-side power driving circuit (LDM 130). For example, the HDM 125 and the LDM 130 may be configured to control the HSPP 110 and the LSPP 115 to maintain a voltage and current at a switch node 135 at a level suitable for the motor 105. For example, the APCS 100 may be configured to generate the VGHS and the VGLS based on a turn-on driving scheme in motor drive application.

As shown, the HDM 125 receives a control input (a pulse width modulation (PWM) signal). The HDM 125 includes an auto-adaptive control circuit (AACC 140) to generate the VGHS to the HSPP 110 as a function of the PWM signal. In some implementations, the AACC 140 may include timing control logic to generate VGHS based on sense input from a sense module 150.

The sense module 150 includes a source inductance voltage sense 155 and a switch node voltage sense 160. For example, the switch node voltage sense 160 may be configured to sense (e.g., detect based on a predetermined voltage threshold) at the switch node 135. In some implementations, the source inductance voltage sense 155 may be configured to measure a bond-wire voltage of the MOSFET in the HSPP 110. In some implementations, the source inductance voltage sense 155 may be configured to measure a copper clip voltage of the MOSFET in the HSPP 110. For example, the source inductance voltage sense 155 may sense a voltage across a capacitor inductance of the bond wire in a package of the HSPP 110. In some examples, the source inductance voltage sense 155 may sense a voltage across inductors connected to a source terminal parasitic inductance of a PCB trace of the HSPP 110.

In some implementations, the AACC 140 may be configured to, upon being activated by the PWM signal, adaptively time-control the VGHS based on a transient response at the switch node 135 and a source inductance voltage of the HSPP 110. In some examples, the AACC 140 may advantageously control switching loss of the HSPP 110 without sacrificing voltage spike during the transient state of the HSPP 110.

As an illustrative example without limitation, in medium-voltage and/or high-voltage hard-switching power converter topologies, there may be a trade-off between voltage spike and/or electromagnetic interference (EMI) requirement and switching loss when tuning the gate drive speed. For example, the AACC 140 may be configured to adaptively adjust, based on the source inductance voltage sense 155 and the switch node voltage sense 160, a turn-on speed of the HSPP 110 to limit a voltage spike during a transient from an OFF state to an ON state at the MOSFETs of the HSPP 110. Various embodiments may advantageously reduce a turn-on loss at (e.g., parallel connected) MOSFETs in the APCS 100.

In some implementations, the APCS 100 may be configured to include multiple power stages (e.g., including a high-side and a low-side). For example, the multiple power stages may be activated by multi-stage turn-on power stage activation signals (e.g., the VGHS and the VGLS). In some implementations, the multi-stage turn-on power stage activation signals may be generated by the AACC 140 based on a sensed MOSFET source inductance voltage and switching node voltage. Various implementations may advantageously adapt the power stage activation signals to different loading current automatically (e.g., for AC motor drive applications). In some examples, the AACC 140 may be configured to reduce switching loss without sacrificing a voltage spike requirement of the HSPP 110.

In various implementations, a gate drive timing control unit (e.g., the APCS 100) may include a control output (e.g., the VGHS) operably coupled to a gate terminal of a power metal-oxide-semiconductor field-effect transistor (power MOSFET), and is configured to generate a power stage activation signal to control a power stage (e.g., the HSPP 110) of the gate drive timing control unit. For example, the PWM signal may be configured to control an output current of the power MOSFET to a load (e.g., the motor 105). For example, a sense circuit (e.g., the sense module 150) may be coupled to the power MOSFET to measure a switch node voltage and a source inductance voltage of the power MOSFET. For example, the gate drive timing control unit may include an auto-adaptive control circuit (e.g., the AACC 140) configured to generate the power stage activation signal as a function of the switch node voltage and the source inductance voltage. For example, the power stage activation signal may be adaptively generated as a function of dynamic load conditions to reduce turn-on loss of the power MOSFET while keeping a low transient voltage spike.

Figure 2:
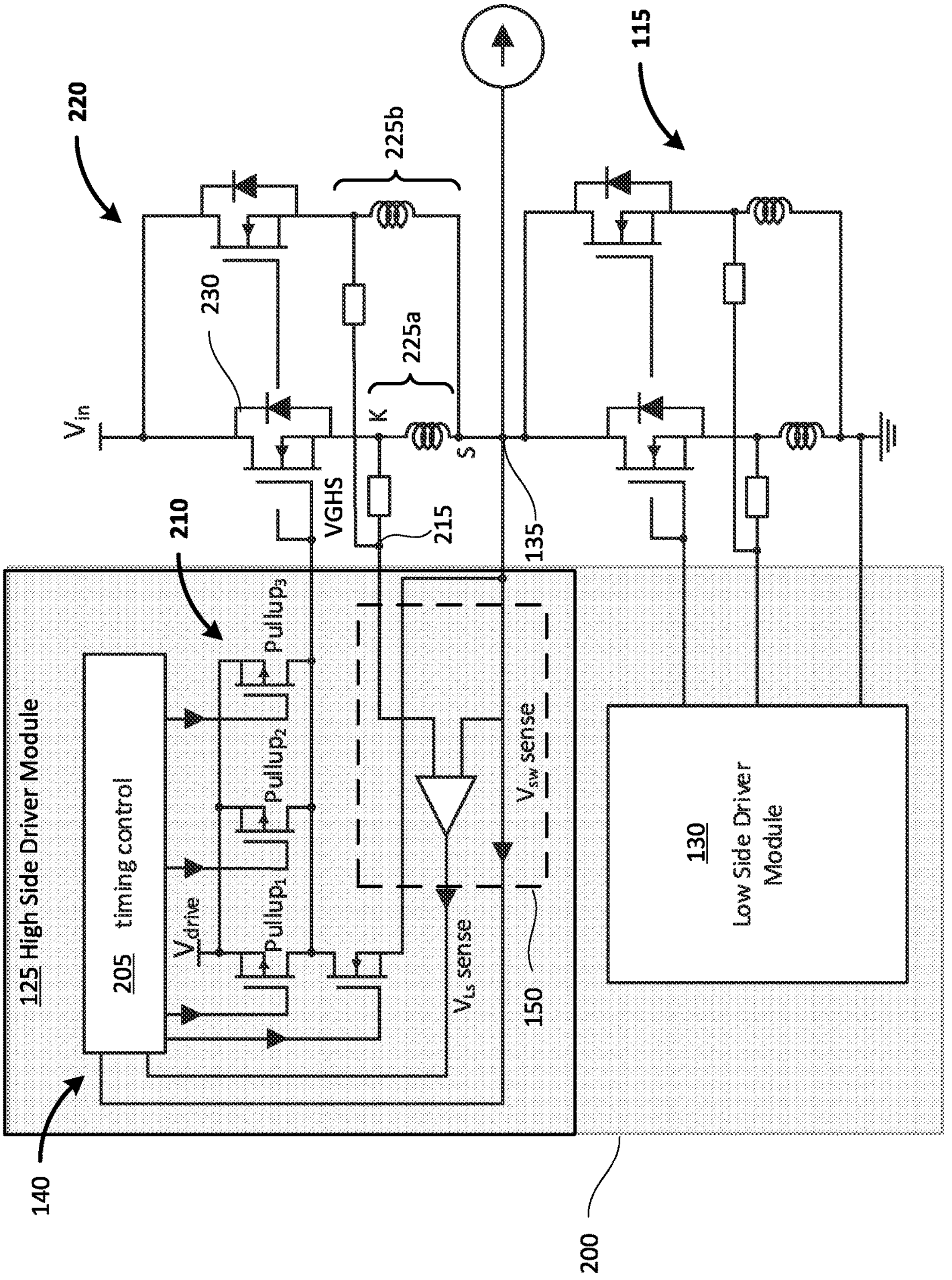
FIG. 2 depicts an exemplary electrical schematic of a multi-stage gate control circuit (MSGCC).

FIG. 2 depicts an exemplary electrical schematic of a multi-stage gate control circuit (MSGCC). In this example, the MSGCC 200 includes the HDM 125 and the LDM 130. Some electronic components of the HDM 125 are depicted in FIG. 2. In some examples, the LDM 130 may include a similar electronic structure (e.g., and/or a mirror image thereof) to the HDM 125.

In the depicted example, the AACC 140 of the HDM 125/includes a timing control logic 205 and three pullup MOSFETs 210 (pullup1, pullup2, and pullup3). In some implementations, the timing control logic 205 may generate pull up stage signals to (independently) control the three pullup MOSFETs 210. For example, the timing control logic 205 may be activated by the PWM signal. For example, the gate terminals of a power MOSFET 230 in the HDM 125 may receive a control signal of a combined (e.g., aggregate) output from the three pullup MOSFETs 210. As shown, the timing control logic 205 may receive inputs from the sense module 150.

In this example, the sense module 150 may be configured to sense a MOSFET source bond-wire (e.g., a clip voltage) at a source bond-wire point 215, and a voltage at the switch node 135. For example, the source inductance voltage sense 155 may be configured to be determined based on a comparison between the switch node voltage at the switch node 135 and the bond-wire voltage at the source bond-wire point 215.

As shown, the HDM 125 may generate the VGHS by connecting source terminals of the three pullup MOSFETs 210 (Pullup1, Pullup2, and Pullup3 as shown in this example) in parallel to gate terminals of each parallel connected power MOSFET of a high-side switch (HS switch 220). For example, the HSPP 110 may include the HS switch 220. As shown, each of the power MOSFETs of the HS switch 220 may include a different parasitic inductance and resistance 225*a*, 225*b*. For example, a voltage across k and s may be a sensing voltage for the voltage drop across the source inductance. For example, the source inductance may indicate a change of current flowing through a MOSFET source terminal of the HS switch 220.

Figure 3:
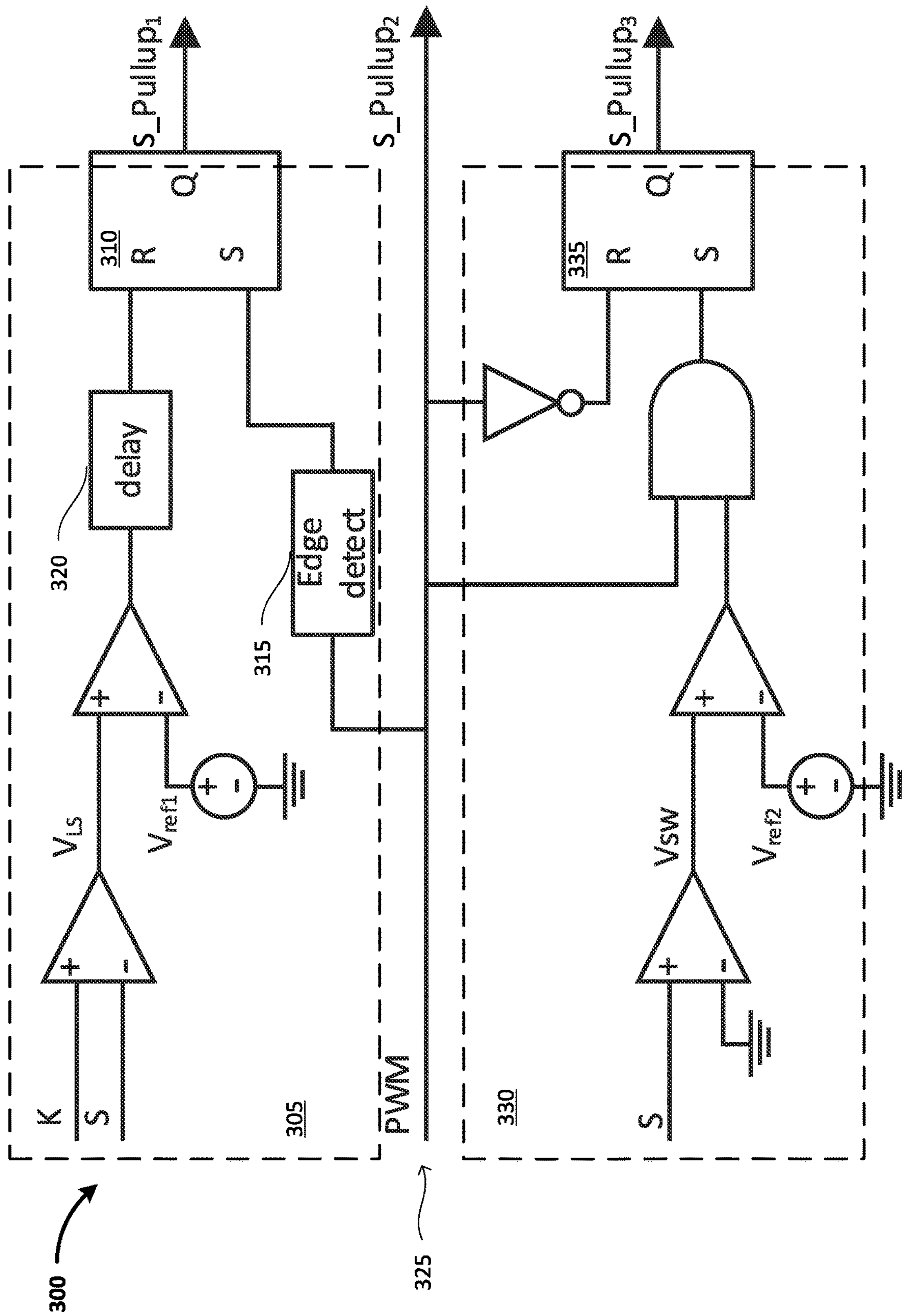
FIG. 3 is a block diagram depicting an exemplary time control logic.

FIG. 3 is a block diagram depicting an exemplary time control logic 300. For example, the timing control logic 205 may include the time control logic 300. As shown, the time control logic 300 includes three outputs, S_pullup1, S_pullup2, and S_pullup3. For example, each of the S_pullup1, S_pullup2, and S_pullup3 may control each of the three pullup MOSFETs 210, pullup1, pullup2, and pullup3, respectively.

For example, the time control logic 300 may be configured to generate the power stage activation signals (VGHS of FIG. 1) for a multi-stage driving scheme to reduce the MOSFET turn-on loss while keeping the transient voltage spike low. For example, the time control logic 300 may be configured to adaptively generate the power stage activation signals for a multi-stage driving scheme under different load conditions.

As shown, a first stage 305 includes a set-reset latch (SR latch 310). For example, the S_pullup1 may be configured to activate the pullup1 MOSFET when the SR latch 310 is in a set state. As shown, the SR latch 310 is set by an edge detect 315 of the PWM signal (e.g., as described with reference to FIG. 1). For example, the first stage 305 may be a fast turn-on state started by the PWM signal. For example, the first stage 305 may include a low pullup resistor to facilitate a fast turn-on response. In the depicted example, the first stage 305 may be ended by a detection of the source inductance voltage. For example, the source inductance voltage may be determined by a detection of VLS larger than a predetermined reference voltage (Vref1). In this example, the SR latch 310 may be reset after a predetermined delay 320 upon the source inductance voltage is detected.

The time control logic 300 includes a second stage 325. In some implementations, the second stage 325 may be configured as a damping stage. For example, the second stage 325 may be connected to a high pullup resistor. For example, the second stage 325 may be synchronized with the PWM signal.

The time control logic 300 includes a third stage 330. In some implementations, the third stage 330 may be configured as a fast-enhance stage. As shown, the third stage 330 includes a second SR latch 335. For example, the third stage 330 may be activated by a detection of the switching node voltage. In some examples, the third stage 330 may speed up (e.g., promote) turn-on of the HDM 125 after detecting a switching node voltage slew.

As shown, the S_pullup3 is set by a detection of the switch node voltage above a predetermined second reference voltage (Vref2) and the PWM signal. The S_pullup3 is reset by an inverse of the PWM signal (e.g., when the power stage is deactivated). In some implementations, the third stage 330 may be activated by a control logic based on the source inductance voltage VLS.

Figure 4:
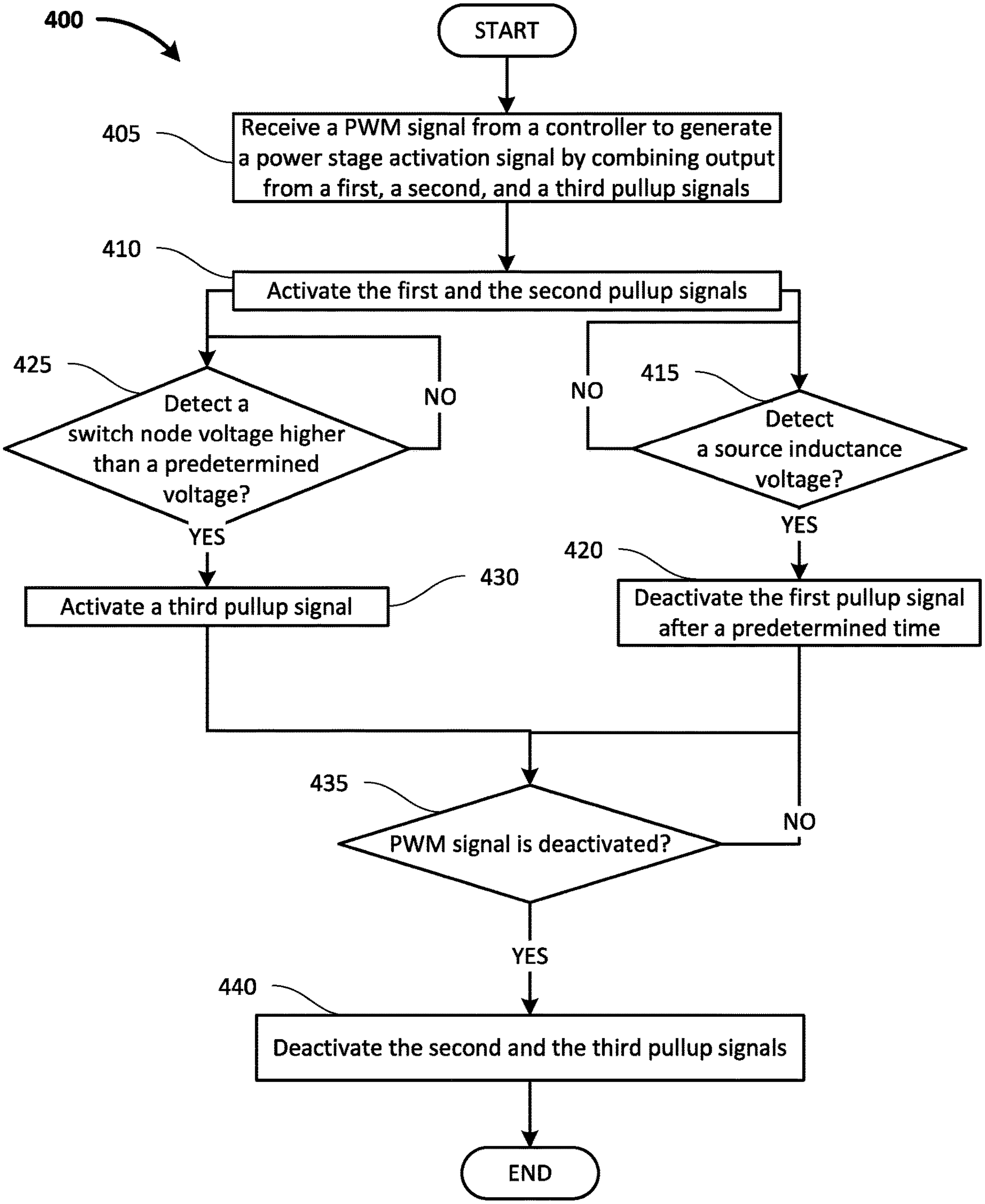
FIG. 4 is a flowchart illustrating an exemplary adaptive power stage activation signals generation method.

FIG. 4 is a flowchart illustrating an exemplary adaptive power stage activation signals generation method. For example, a method 400 may be performed by the time control logic 300. In this example, the method 400 begins in step 405 when a PWM signal is received from a controller to generate a power stage activation signal by combining output from a first, a second, and a third pullup signals. For example, the time control logic 300 of the AACC 140 may receive the PWM signal received by the AACC 140.

In step 410, the first and the second pullup signals are activated. For example, the time control logic 300 may activate the S_pullup1 and S_pullup2 signals to drive the pullup MOSFETs 210.

At a decision point 415, it is determined whether a source inductance voltage is detected. For example, the time control logic 300 may compare the sensed source inductance voltage with a predetermined threshold. If the source inductance voltage is detected, the first pullup signal is deactivated after a predetermined time in step 420. For example, the time control logic 300 may deactivate S_pullup1 after a delay based on the sensed source inductance voltage. If the source inductance voltage is not detected, the decision point 415 is repeated.

Operating in parallel, after the step 410, it is determined whether a switch node voltage higher than a predetermined voltage is detected at a decision point 425, it is determined whether a switch node voltage higher than a predetermined voltage is detected. For example, the time control logic 300 may check if the switch node voltage (e.g., the V_SW_sense signal) exceeds a set reference voltage. If the switch node voltage is higher than the predetermined voltage, in step 430, a third pullup signal is activated. For example, the time control logic 300 may activate S_pullup3 to speed up the turn-on of the HS switch 220. If the switch node voltage is not higher than a predetermined voltage, the decision point 425 is repeated.

At a decision point 435, it is determined whether the PWM signal is deactivated. For example, the time control logic 300 may check if the PWM signal is no longer active. If the PWM signal is deactivated, in step 440, the second and the third pullup signals are deactivated. For example, the time control logic 300 may deactivate S_pullup2 and S_pullup3 to turn off the corresponding pullup MOSFETs 210, and the method 400 ends.

Although some exemplary control methods are described using a multi-stage turn-on of the connected power semiconductor devices, multi-stage turn-off schemes based on source inductance voltage may be used to control a timing of gate signals. For example, a multi-stage turn-off control logic may be implemented independent of and/or together with the multi-stage turn on scheme.

Figure 5:
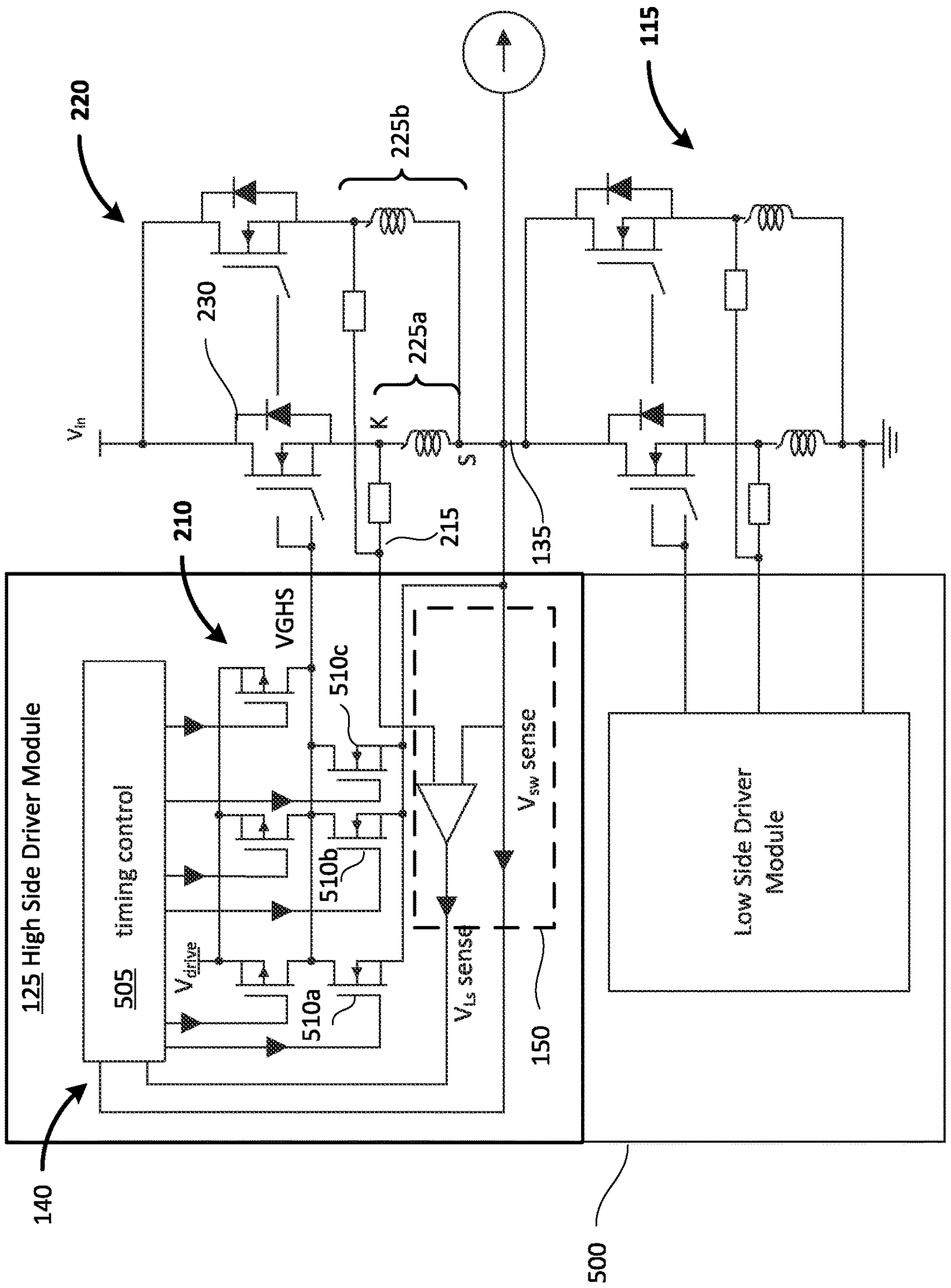
FIG. 5 depicts an exemplary electrical schematic of a MSGCC including a multi-stage turn-off timing scheme.

FIG. 5 depicts an exemplary electrical schematic of a MSGCC including a multi-stage turn-off timing scheme. In this example, a MSGCC 500 includes a timing control logic 505 operably coupled to the three pullup MOSFETs 210 and three pulldown MOSFETs 510*a*, 510*b*, and 510*c*. For example, the timing control logic 505 may control the three pullup MOSFETs 210 according to a timing logic described with reference to FIGS. 2-3. In various implementations, the timing control logic 505 may adaptively control a gate-turn off signal based on a PWM signal and a sensed source inductance voltage VLS_Sense. For example, the timing control logic 505 may advantageously reduce a turn-off loss at (e.g., parallel connected) MOSFETs of a power stage (e.g., the HS switch 220). For example, upon activation, the three pulldown MOSFETs 510*a*, 510*b*, and 510*c* may pull-down the power stage activation. For example, some embodiments may advantageously adaptively control a turn-off scheme of the power stage activation signals to different loading current automatically.

In some implementations, a gate control signal (e.g., the VGHS) may be generated as an aggregation of outputs of three pulldown MOSFETs 510*a*, 510*b*, and 510*c*. For example, when the power stage (e.g., the HS switch 220) is turned off by the PWM signal, the gate control signal may be generated in three stages. For example, in a first stage, the gate control signal may include a first turn-off signal configured to trigger a fast response at a power MOSFET controlled by the gate control signal (e.g., the power MOSFET 230). For example, in a second stage, the gate control signal may include a damping signal configured to reduce voltage spike at the power MOSFET. For example, in a third stage, the gate control signal may include a fast turn-off signal configured to speed up (e.g., promote) turn-off of the power MOSFET after the first voltage peak during the switching transient (e.g., the voltage spike at the second stage).

Figure 6:
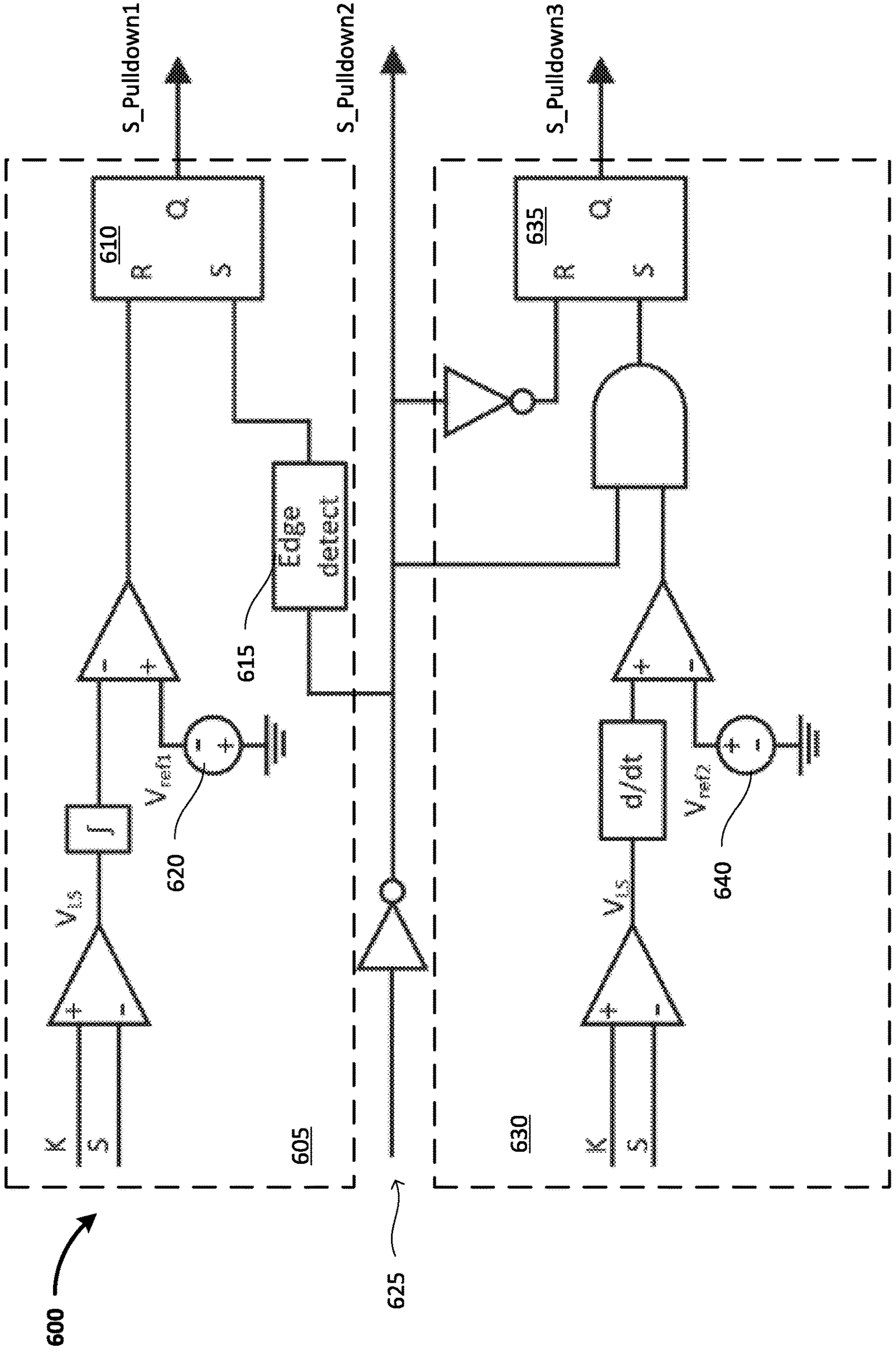
FIG. 6 is a block diagram depicting an exemplary time control logic for a multi-stage turn-off timing scheme.

FIG. 6 is a block diagram depicting an exemplary time control logic 600 for a multi-stage turn-off timing scheme. For example, the timing control logic 505 may include the time control logic 600. As shown, the time control logic 600 includes three outputs, S_pulldown1, S_pulldown2, and S_pulldown3. For example, each of the S_pulldown1, S_pulldown2, and S_pulldown3 may control each of the three pulldown MOSFETs 510*a*, 510*b*, and 510*c*, respectively.

For example, the time control logic 600 may be configured to generate the power stage gate signals for a multi-stage driving scheme to reduce the MOSFET turn-off loss while keeping the transient voltage spike low. For example, the time control logic 600 may be configured to adaptively generate the power stage gate signals for a multi-stage driving scheme under different load conditions.

In this example, a first pulldown stage 605 includes a set-reset latch (SR latch 610). For example, the S_pulldown1 may be configured to pull down the gate voltage at the HS switch 220 when the SR latch 610 is in a set state. As shown, the SR latch 610 is set by an edge detect 615 of the PWM signal (e.g., as described with reference to FIG. 1). For example, the S_pulldown1 may be triggered by the falling edge of the PWM signal. For example, the first stage 605 may be a fast turn-off state started by the PWM signal. In the depicted example, the first stage 305 may be ended (e.g., reset of the SR latch 610) when an integration of a detected source inductance voltage (VLS) is lower than a predetermined negative reference voltage (Vref1 620).

The time control logic 600 includes a second stage 625. In some implementations, the second stage 625 may be configured as a damping stage. For example, the second stage 625 may be synchronized with the PWM signal.

The time control logic 600 includes a third stage 630. The third stage 630 includes a second SR latch 635 connected to an output signal (S_pulldown3). As shown, the S_pullup3 is set when the derivation of the detected source inductance voltage (VLS) becomes higher than a predetermined positive reference voltage (Vref2 640). The S_pullup3 is reset by the PWM signal. Various embodiments may adaptively adjust a turn-off timing of the HS switch 220 based on the source inductance voltage.

Although various embodiments have been described with reference to the figures, other embodiments are possible. For example, various transistors may be depicted and/or described to be in p-channel MOSFETs or n-channel MOSFETs. In some implementations, these transistors may be adapted to be implemented in different types of MOSFETs by changing some connections in the circuitry.

Although an exemplary system has been described with reference to the figures, other implementations may be deployed in other industrial, scientific, medical, commercial, and/or residential applications.

In some implementations, the APCS 100 may be used in industrial machinery. For example, the motor 105 may include high-power AC motors used to drive pumps and compressors in industries including, for example, oil and gas, water treatment, and chemical processing. For example, the motor 105 may power conveyor systems for moving heavy materials and/or products across a distance.

In some implementations, the APCS 100 may be used to drive motors in mining equipment. For example, the motor 105 may be configured to operate large-scale excavation equipment and drills. For example, the APCS 100 may be configured to drive crushing and grinding equipment in mining operations.

In some implementations, the APCS 100 may be used to drive high-power AC motors in induction heating systems (e.g., furnaces for melting and processing metals at high temperatures). In some examples, the APCS 100 may be used to drive a motor for propulsion of electric trains and locomotives.

In some implementations, the APCS 100 may be used to drive motors in a factory (e.g., in manufacturing applications). In some examples, the APCS 100 may be configured to drive a motor to operate construction equipment including, for example, cranes and hoists for lifting and moving heavy loads.

In an illustrative aspect, a gate drive timing control unit may include a control output operably coupled to a gate terminal of a power metal-oxide-semiconductor field-effect transistor (power MOSFET). For example, the gate drive timing control unit may be configured to generate a power stage activation signal to control a power stage of the gate drive timing control unit. For example, the power stage activation signal may be configured to control an output current of the power MOSFET to a load.

For example, the gate drive timing control unit may include a sense circuit coupled to the power MOSFET configured to measure a switch node voltage and a source inductance voltage of the power MOSFET. For example, the gate drive timing control unit may include at least three pullup transistors electrically connected to the control output in parallel, and are configured to generate the power stage activation signal as a function of the switch node voltage and the source inductance voltage.

For example, a first pullup transistor of the at least three pullup transistors may be configured to be activated when a PWM signal may be received. For example, the first pullup transistor may be deactivated based on the source inductance voltage.

For example, a second pullup transistor of the at least three pullup transistors may be configured to be synchronized with the PWM signal. For example, a third pullup transistor of the at least three pullup transistors may be configured to be activated when the switch node voltage may be detected.

For example, the control output may be an aggregation of outputs of the first pullup transistor, the second pullup transistor, and the third pullup transistor. For example, when the power stage may be turned on by the PWM signal, the control output may be generated in three stages. For example, in a first stage, the control output may include a first turn-on signal configured to trigger a fast response at the power MOSFET. For example, in a second stage, the control output may include a damping signal configured to reduce voltage spike at the power MOSFET. For example, in a third stage, the control output may include a fast-enhance signal configured to speed up turn-on of the power MOSFET after a switching node voltage slew may be detected.

For example, the at least three pullup transistors may include a first pullup transistor control circuit coupled to the first pullup transistor. For example, the first pullup transistor control circuit may include a set-reset latch configured to generate a timing signal as a function of a set state and a reset state of the set-reset latch. For example, the first pullup transistor control circuit may include an edge detect circuit configured to set the set-reset latch at a detection of the PWM signal by the edge detect circuit. For example, the first pullup transistor control circuit may include a delay circuit configured to reset the set-reset latch when a positive difference between the source inductance voltage and a first reference voltage exists for a predetermined delay time set by the delay circuit. For example, the first pullup transistor may be activated by the timing signal of the set-reset latch in the set state. For example, the first pullup transistor may be deactivated by the timing signal of the set-reset latch in the reset state.

For example, the source inductance voltage may be determined based on a comparison between the switch node voltage and a bond-wire voltage of the power MOSFET. For example, the power MOSFET may be packaged in a printed circuit board, and measuring the bond-wire voltage may include measuring a source terminal parasitic inductance of the power MOSFET of a printed circuit board trace of the printed circuit board.

For example, the control output may be connected to, in parallel, gate terminals of a plurality of parallel connected power MOSFET. For example, the plurality of parallel connected power MOSFET may include a variation of threshold voltages.

The gate drive timing control unit may include at least three pulldown transistors electrically connected to the control output in parallel. For example, the at least three pulldown transistors are configured. For example, upon activation, the power stage activation signal may be pulled down by the at least three pulldown transistors. For example, a first pulldown transistor of the at least three pulldown transistors may be configured to be activated by detection of a falling edge of the PWM signal. For example, a second pulldown transistor of the at least three pulldown transistors may be configured to be synchronized with the PWM signal. For example, a third pulldown transistor of the at least three pulldown transistors may be configured to be activated when a derivation of the source inductance voltage may be higher than a predetermined positive reference voltage.

For example, the first pulldown transistor may be deactivated when an integration of the source inductance voltage may be lower than a predetermined negative reference voltage.

For example, the control output may include an aggregation of outputs of the first pulldown transistor, the second pulldown transistor, and the third pulldown transistor. For example, when the power stage is turned off by the PWM signal, the control output may be generated in three stages. For example, in a first stage, the control output may include a first turn-off signal configured to trigger a fast response at the power MOSFET. For example, in a second stage, the control output may include a damping signal configured to reduce voltage spike at the power MOSFET. For example, in a third stage, the control output may include a fast turn-off signal configured to speed up turn-off of the power MOSFET after the voltage spike at the second stage.

In an illustrative aspect, a half-bridge gate driver may include a high side driver module may include a first instance of the gate drive timing control unit in a high side. For example, the half-bridge gate driver may include a low side driver module. For example, the low side driver module may include a second instance the gate drive timing control unit in a low side. For example, the PWM signal of the first instance may be an inverse of the PWM signal of the second instance.

In an illustrative aspect, a gate drive timing control unit may include a control output operably coupled to a gate terminal of a power metal-oxide-semiconductor field-effect transistor (power MOSFET), and may be configured to generate a power stage activation signal to control a power stage of the gate drive timing control unit. For example, the power stage activation signal may be configured to control an output current of the power MOSFET to a load. For example, the gate drive timing control unit may include a sense circuit coupled to the power MOSFET configured to measure a switch node voltage and a source inductance voltage of the power MOSFET. For example, the gate drive timing control unit may include an auto-adaptive control circuit configured to generate the power stage activation signal as a function of the switch node voltage and the source inductance voltage. For example, the power stage may include a first stage triggered by a pulse width modulation signal (PWM signal) and ended by a detection of the source inductance voltage. For example, the power stage may include a second stage synchronized with the PWM signal. For example, the power stage may include a third stage triggered by a detection of the switch node voltage. For example, the power stage activation signal may be adaptively generated as a function of load conditions.

For example, the auto-adaptive control circuit may include at least three pullup transistors electrically connected to the control output in parallel. For example, a first pullup transistor of the at least three pullup transistors may be configured to be activated when the PWM signal may be received. For example, the first pullup transistor may be deactivated based on the source inductance voltage. For example, a second pullup transistor of the at least three pullup transistors may be configured to be synchronized with the PWM signal. For example, a third pullup transistor of the at least three pullup transistors may be configured to be activated when the switch node voltage may be detected.

For example, the control output may be an aggregation of outputs of the first pullup transistor, the second pullup transistor, and the third pullup transistor. For example, when the power stage may be turned on by the PWM signal, the control output may be generated in three stages. For example, in the first stage, the control output may include a first turn-on signal configured to trigger a fast response at the power MOSFET. For example, in the second stage, the control output may include a damping signal configured to reduce voltage spike at the power MOSFET. For example, in the third stage, the control output may include a fast-enhance signal configured to speed up turn-on of the power MOSFET after a switching node voltage slew may be detected.

For example, the at least three pullup transistors may include a first pullup transistor control circuit coupled to the first pullup transistor. For example, the first pullup transistor control circuit may include a set-reset latch configured to generate a timing signal as a function of a set state and a reset state of the set-reset latch. For example, the first pullup transistor control circuit may include an edge detect circuit configured to set the set-reset latch at a detection of the PWM signal by the edge detect circuit. For example, the first pullup transistor control circuit may include a delay circuit configured to reset the set-reset latch when a positive difference between the source inductance voltage and a first reference voltage exist for a predetermined delay time set by the delay circuit. For example, the first pullup transistor may be activated by the timing signal of the set-reset latch in the set state. For example, the first pullup transistor may be deactivated by the timing signal of the set-reset latch in the reset state.

For example, the source inductance voltage may be determined based on a comparison between the switch node voltage and a bond-wire voltage of the power MOSFET.

For example, the power MOSFET may be packaged in a printed circuit board, and measuring the bond-wire voltage may include measuring a source terminal parasitic inductance of the power MOSFET of a printed circuit board trace of the printed circuit board.

For example, the control output may be connected to, in parallel, gate terminals of a plurality of parallel connected power MOSFET. For example, the plurality of parallel connected power MOSFET may include a variation of threshold voltages.

The gate drive timing control unit may include at least three pulldown transistors electrically connected to the control output in parallel. For example, the at least three pulldown transistors are configured. For example, upon activation, the power stage activation signal may be pulled down by the at least three pulldown transistors. For example, a first pulldown transistor of the at least three pulldown transistors may be configured to be activated by detection of a falling edge of the PWM signal. For example, a second pulldown transistor of the at least three pulldown transistors may be configured to be synchronized with the PWM signal. For example, a third pulldown transistor of the at least three pulldown transistors may be configured to be activated when a derivation of the source inductance voltage may be higher than a predetermined positive reference voltage.

For example, the first pulldown transistor may be deactivated when an integration of the source inductance voltage may be lower than a predetermined negative reference voltage.

For example, the control output may include an aggregation of outputs of the first pulldown transistor, the second pulldown transistor, and the third pulldown transistor. For example, when the power stage is turned off by the PWM signal, the control output may be generated in three stages. For example, in a first stage, the control output may include a first turn-off signal configured to trigger a fast response at the power MOSFET. For example, in a second stage, the control output may include a damping signal configured to reduce voltage spike at the power MOSFET. For example, in a third stage, the control output may include a fast turn-off signal configured to speed up turn-off of the power MOSFET after the voltage spike at the second stage.

In an illustrative aspect, a half bridge gate driver may include a high side driver module may include a first instance of the gate drive timing control unit in a high side. For example, the half bridge gate driver may include a low side driver module. For example, the low side driver module may include a second instance of the gate drive timing control unit in a low side. For example, a PWM signal received by the first instance may be an inverse of a second PWM signal received by the second instance.

In an illustrative aspect, an adaptively timed gate control signal generation method, may include, in response to receiving a pulse width modulation signal, generate a power stage activation signal may include a first pullup signal and a second pullup signal. For example, a plurality of power transistors may be turned on by the power stage activation signal received at corresponding gate terminal of the plurality of power transistors. For example, upon activation, the plurality of power transistors generates a source inductance voltage and a switch node voltage.

For example, the adaptively timed gate control signal generation method may include, upon detecting the source inductance voltage at the plurality of power transistors, deactivate the first pullup signal of the power stage activation signal after a predetermined delay.

For example, the adaptively timed gate control signal generation method may include, upon detecting the switch node voltage, activating a third pullup signal. For example, the power stage activation signal combines the first pullup signal, the second pullup signal, and the third pullup signal as a function of the source inductance voltage and the switch node voltage, each dependent on a load connected to the plurality of power transistors. For example, the power stage activation signal may be adaptively generated as a function of load conditions to reduce turn-on loss of the plurality of power transistors while keeping a low transient voltage spike.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A gate drive timing control unit comprising:

a control output operably coupled to a gate terminal of a power metal-oxide-semiconductor field-effect transistor (power MOSFET), and is configured to generate a power stage activation signal to control a power stage of the gate drive timing control unit, wherein the power stage activation signal is configured to control an output current of the power MOSFET to a load;

a sense circuit coupled to the power MOSFET configured to measure a switch node voltage and a source inductance voltage of the power MOSFET; and, at least three pullup transistors electrically connected to the control output in parallel, and are configured to generate the power stage activation signal as a function of the switch node voltage and the source inductance voltage, wherein:

a first pullup transistor of the at least three pullup transistors is configured to be activated when a PWM signal is received, and deactivated based on the source inductance voltage;

a second pullup transistor of the at least three pullup transistors is configured to be synchronized with the PWM signal; and, a third pullup transistor of the at least three pullup transistors is configured to be activated when the switch node voltage is detected.

2. The gate drive timing control unit of claim 1, wherein the control output is an aggregation of outputs of the first pullup transistor, the second pullup transistor, and the third pullup transistor, wherein, when the power stage is turned on by the PWM signal, the control output is generated in three stages, wherein:

in a first stage, the control output comprises a first turn-on signal configured to trigger a fast response at the power MOSFET;

in a second stage, the control output comprises a damping signal configured to reduce voltage spike at the power MOSFET; and, in a third stage, the control output comprises a fast-enhance signal configured to speed up turn-on of the power MOSFET after a switching node voltage slew is detected.

3. The gate drive timing control unit of claim 1, wherein the at least three pullup transistors comprise a first pullup transistor control circuit coupled to the first pullup transistor, wherein the first pullup transistor control circuit comprises:

a set-reset latch configured to generate a timing signal as a function of a set state and a reset state of the set-reset latch;

an edge detect circuit configured to set the set-reset latch at a detection of the PWM signal by the edge detect circuit; and, a delay circuit configured to reset the set-reset latch when a positive difference between the source inductance voltage and a first reference voltage exist for a predetermined delay time set by the delay circuit, wherein the first pullup transistor is activated by the timing signal of the set-reset latch in the set state, and deactivated by the timing signal of the set-reset latch in the reset state.

4. The gate drive timing control unit of claim 1, wherein the source inductance voltage is determined based on a comparison between the switch node voltage and a bond-wire voltage of the power MOSFET.

5. The gate drive timing control unit of claim 4, wherein the power MOSFET is packaged in a printed circuit board, and measuring the bond-wire voltage comprises measuring a source terminal parasitic inductance of the power MOSFET of a printed circuit board trace of the printed circuit board.

6. The gate drive timing control unit of claim 1, wherein the control output is connected to, in parallel, gate terminals of a plurality of parallel connected power MOSFET, wherein the plurality of parallel connected power MOSFET comprises a variation of threshold voltages.

7. The gate drive timing control unit of claim 1, further comprises at least three pulldown transistors electrically connected to the control output in parallel, wherein the at least three pulldown transistors are configured such that, upon activation, the power stage activation signal is pulled down by the at least three pulldown transistors, wherein:

a first pulldown transistor of the at least three pulldown transistors is configured to be activated by detection of a falling edge of the PWM signal;

a second pulldown transistor of the at least three pulldown transistors is configured to be synchronized with the PWM signal; and, a third pulldown transistor of the at least three pulldown transistors is configured to be activated when a derivation of the source inductance voltage is higher than a predetermined positive reference voltage.

8. The gate drive timing control unit of claim 7, wherein the control output comprises an aggregation of outputs of the first pulldown transistor, the second pulldown transistor, and the third pulldown transistor, wherein, when the power stage is turned off by the PWM signal, the control output is generated in three stages, wherein:

in a first stage, the control output comprises a first turn-off signal configured to trigger a fast response at the power MOSFET;

in a second stage, the control output comprises a damping signal configured to reduce voltage spike at the power MOSFET; and, in a third stage, the control output comprises a fast turn-off signal configured to speed up turn-off of the power MOSFET after the voltage spike at the second stage.

9. A half-bridge gate driver comprises:

a high side driver module comprising a first instance of the gate drive timing control unit of claim 1 in a high side; and, a low side driver module comprising a second instance of the gate drive timing control unit of claim 1 in a low side, wherein the PWM signal of the first instance is an inverse of the PWM signal of the second instance.

10. A gate drive timing control unit comprising:

a control output operably coupled to a gate terminal of a power metal-oxide-semiconductor field-effect transistor (power MOSFET), and is configured to generate a power stage activation signal to control a power stage of the gate drive timing control unit, wherein the power stage activation signal is configured to control an output current of the power MOSFET to a load;

a sense circuit coupled to the power MOSFET configured to measure a switch node voltage and a source inductance voltage of the power MOSFET; and, an auto-adaptive control circuit configured to generate the power stage activation signal as a function of the switch node voltage and the source inductance voltage comprising:

a first stage triggered by a pulse width modulation signal (PWM signal) and ended by a detection of the source inductance voltage;

a second stage synchronized with the PWM signal; and, a third stage triggered by a detection of the switch node voltage, such that the power stage activation signal is adaptively generated as a function of load conditions, wherein the source inductance voltage is determined based on a comparison between the switch node voltage and a bond-wire voltage of the power MOSFET.

11. The gate drive timing control unit of claim 10, wherein the auto-adaptive control circuit comprises at least three pullup transistors electrically connected to the control output in parallel, wherein:

a first pullup transistor of the at least three pullup transistors is configured to be activated when the PWM signal is received, and deactivated based on the source inductance voltage;

a second pullup transistor of the at least three pullup transistors is configured to be synchronized with the PWM signal; and, a third pullup transistor of the at least three pullup transistors is configured to be activated when the switch node voltage is detected.

12. The gate drive timing control unit of claim 11, wherein the control output is an aggregation of outputs of the first pullup transistor, the second pullup transistor, and the third pullup transistor, wherein, when the power stage is turned on by the PWM signal, the control output is generated in three stages, wherein:

in the first stage, the control output comprises a first turn-on signal configured to trigger a fast response at the power MOSFET;

in the second stage, the control output comprises a damping signal configured to reduce voltage spike at the power MOSFET; and, in the third stage, the control output comprises a fast-enhance signal configured to speed up turn-on of the power MOSFET after a switching node voltage slew is detected.

13. The gate drive timing control unit of claim 11, wherein the at least three pullup transistors comprise a first pullup transistor control circuit coupled to the first pullup transistor, wherein the first pullup transistor control circuit comprises:

a set-reset latch configured to generate a timing signal as a function of a set state and a reset state of the set-reset latch;

an edge detect circuit configured to set the set-reset latch at a detection of the PWM signal by the edge detect circuit; and, a delay circuit configured to reset the set-reset latch when a positive difference between the source inductance voltage and a first reference voltage exists for a predetermined delay time set by the delay circuit, wherein the first pullup transistor is activated by the timing signal of the set-reset latch in the set state, and deactivated by the timing signal of the set-reset latch in the reset state.

14. The gate drive timing control unit of claim 10, wherein the power MOSFET is packaged in a printed circuit board, and measuring the bond-wire voltage comprises measuring a source terminal parasitic inductance of the power MOSFET of a printed circuit board trace of the printed circuit board.

15. A half bridge gate driver comprises:

a high side driver module comprising a first instance of the gate drive timing control unit of claim 10 in a high side; and, a low side driver module comprising a second instance the gate drive timing control unit of claim 10 in a low side, wherein a PWM signal received by the first instance is an inverse of a second PWM signal received by the second instance.

16. A gate drive timing control unit comprising:

a control output operably coupled to a gate terminal of a power metal-oxide-semiconductor field-effect transistor (power MOSFET), and is configured to generate a power stage activation signal to control a power stage of the gate drive timing control unit, wherein the power stage activation signal is configured to control an output current of the power MOSFET to a load;

a sense circuit coupled to the power MOSFET configured to measure a switch node voltage and a source inductance voltage of the power MOSFET; and, an auto-adaptive control circuit configured to generate the power stage activation signal as a function of the switch node voltage and the source inductance voltage comprising:

a first stage triggered by a pulse width modulation signal (PWM signal) and ended by a detection of the source inductance voltage;

a second stage synchronized with the PWM signal; and, a third stage triggered by a detection of the switch node voltage, such that the power stage activation signal is adaptively generated as a function of load conditions, wherein the control output is connected to, in parallel, gate terminals of a plurality of parallel connected power MOSFET, wherein the plurality of parallel connected power MOSFET comprises a variation of threshold voltages.

17. The gate drive timing control unit of claim 16, further comprises at least three pulldown transistors electrically connected to the control output in parallel, wherein the at least three pulldown transistors are configured such that, upon activation, the power stage activation signal is pulled down by the at least three pulldown transistors, wherein:

a first pulldown transistor of the at least three pulldown transistors is configured to be activated by detection of a falling edge of the PWM signal;

a second pulldown transistor of the at least three pulldown transistors is configured to be synchronized with the PWM signal; and, a third pulldown transistor of the at least three pulldown transistors is configured to be activated when a derivation of the source inductance voltage is higher than a predetermined positive reference voltage.

18. The gate drive timing control unit of claim 17, wherein the control output comprises an aggregation of outputs of the first pulldown transistor, the second pulldown transistor, and the third pulldown transistor, wherein, when the power stage is turned off by the PWM signal, the control output is generated in three stages, wherein:

in a first stage, the control output comprises a first turn-off signal configured to trigger a fast response at the power MOSFET;

in a second stage, the control output comprises a damping signal configured to reduce a voltage spike at the power MOSFET; and, in a third stage, the control output comprises a fast turn-off signal configured to promote a deactivation of the power MOSFET after the voltage spike at the second stage.

19. An adaptively timed gate control signal generation method, comprising:

in response to receiving a pulse width modulation signal, generate a power stage activation signal comprising a first pullup signal and a second pullup signal, such that a plurality of power transistors are turned on by the power stage activation signal received at corresponding gate terminal of the plurality of power transistors, wherein, upon activation, the plurality of power transistors generates a source inductance voltage and a switch node voltage;

upon detecting the source inductance voltage at the plurality of power transistors, deactivate the first pullup signal of the power stage activation signal after a predetermined delay;

upon detecting the switch node voltage, activate a third pullup signal, wherein the power stage activation signal combines the first pullup signal, the second pullup signal, and the third pullup signal as a function of the source inductance voltage and the switch node voltage, each dependent on a load connected to the plurality of power transistors, such that the power stage activation signal is adaptively generated as a function of load conditions to reduce turn-on loss of the plurality of power transistors while keeping a low transient voltage spike.

* * * * *